US008344361B2

(12) United States Patent
Wernersson et al.

(10) Patent No.: US 8,344,361 B2
(45) Date of Patent: Jan. 1, 2013

(54) SEMICONDUCTOR NANOWIRE VERTICAL DEVICE ARCHITECTURE

(75) Inventors: Lars-Erik Wernersson, Lund (SE); Tomas Bryllert, Göteborg (SE); Erik Lind, Lund (SE); Lars Samuelson, Malmö (SE)

(73) Assignee: QuNano AB, Lund (SE)

( * ) Notice: Subject to any disclaimer, the term of this patent is extended or adjusted under 35 U.S.C. 154(b) by 741 days.

(21) Appl. No.: 11/922,242

(22) PCT Filed: Jun. 16, 2006

(86) PCT No.: PCT/SE2006/050207
§ 371 (c)(1),
(2), (4) Date: Aug. 3, 2009

(87) PCT Pub. No.: WO2006/135337
PCT Pub. Date: Dec. 21, 2006

(65) Prior Publication Data
US 2009/0294757 A1 Dec. 3, 2009

(30) Foreign Application Priority Data
Jun. 16, 2005 (SE) ........................ 0501376

(51) Int. Cl.
*H01L 51/00* (2006.01)
*H01L 29/94* (2006.01)
*H01L 29/76* (2006.01)
*H01L 31/062* (2006.01)
*H01L 31/113* (2006.01)
*H01L 31/119* (2006.01)
(52) U.S. Cl. .......................... 257/40; 257/328
(58) Field of Classification Search ............. 257/40–41, 257/327–334, E39.007, E51.006
See application file for complete search history.

(56) References Cited

U.S. PATENT DOCUMENTS
7,265,376 B2 * 9/2007 Graham et al. ................. 257/40
2001/0023986 A1 * 9/2001 Mancevski .................... 257/741
(Continued)

FOREIGN PATENT DOCUMENTS
DE 10324752 A1 1/2005
(Continued)

OTHER PUBLICATIONS

U.S. Appl. No. 11/922,243, filed Jun. 16, 2006, Wernersson et al.
Hareland, S. A., et al., "New Structural Approach for Reducing Punchthrough Current in Deep Submicrometre MOSFETs and Extending MOSFET Scaling," Electronics Letters, IEE Stevenage, GB, vol. 29, No. 21, Oct. 14, 1993, pp. 1894-1896, ISSN: 0013-5194.

(Continued)

*Primary Examiner* — Cuong Q Nguyen
(74) *Attorney, Agent, or Firm* — The Marbury Law Group PLLC

(57) ABSTRACT

The present invention relates to nanoscaled electronic devices with a vertical nanowire as a functional part. Contacts are arranged on the nanowire at different parts of the nanowire, for example drain and source contacts. In connection to the nanowire contacts are external electrodes, that connect at different levels, as seen from the substrate, of the device. The external electrodes are elongated, and typically and preferably stripe-like. According to the invention a first external electrode, or contacts, associated with contact(s) at a first part of the nanowire, and a second external electrode, associated with contact(s) at a second part of the nanowire are arranged in a cross-bar configuration. The cross-bar configuration minimizes the overlay of the external electrodes, hence, parasitic capacitances and current leakage can be reduced, and the performance of the device improved.

20 Claims, 5 Drawing Sheets

U.S. PATENT DOCUMENTS

2003/0132461 A1     7/2003    Roesner et al.
2004/0214786 A1    10/2004    Hofmann et al.
2005/0029654 A1     2/2005    Mio et al.

FOREIGN PATENT DOCUMENTS

| | | |
|---|---|---|
| JP | 61276265 A | 12/1986 |
| JP | 09307097 A | 11/1997 |
| WO | WO 2004/004927 A2 | 1/2004 |
| WO | 2004040668 A | 5/2004 |
| WO | WO 2005/064664 A1 | 7/2005 |

OTHER PUBLICATIONS

European Search Report, PCT/SE2006050204, May 6, 2009, 7 pages.
European Search Report, Application No. EP 11 17 5291, Jan. 24, 2012, 10 pages.

\* cited by examiner

*Fig. 1a-d (Prior Art)*

SEMICONDUCTOR NANOWIRE VERTICAL DEVICE ARCHITECTURE

CROSS-REFERENCE TO RELATED APPLICATIONS

This application is a National Stage application of PCT/SE2006/050207, filed Jun. 16, 2006, which claims priority from Sweden application SE 0501376-8, filed Jun. 16, 2005.

TECHNICAL FIELD

The present invention relates to a nanowire electronic device architecture. In particular the invention relates to arrangement of external electrodes connecting to terminals, or contacts, of the nanowire electronic device.

BACKGROUND

The interest in nanoscaled electronic devices has during the last decade increased substantially. The interest arises from the continuous need for denser integrated circuits, but also from the realization that nanoscale electronic devices offers new possibilities in terms of operational speed, functionality and power consumption, for example. These new possibilities, but also in some aspects new challenges, are primarily related to the exploration of quantum mechanical effects coming into importance as the size of devices go down to the nano-region. The scaling also allows for an materials integration that may not be achieved in the conventional technologies. Of particular interest are devices based on semiconductor nanowires. Semiconductor nanowires is in this context defined as rod-shaped structures with a diameter less than 200 nm and a length up to several μm. Semiconductor nanowires may be grown on different types of substrates and they can be arranged to grow vertically from the substrate. This enables a number of vertical device technologies, including diodes, transistors, and optical sources and detectors. The nanowire forms the main functional part in these various devices, for example the current channel of a transistor or the light emitting portion of optical source. Common to all such devices are that external electrodes must be formed to get electrical access to the nanowires. Typically nanowires have contacts of conductive material, for example metal, integrally formed with the semiconductor on their end parts. The electrodes include ohmic (i.e. non-rectifying) contacts to the ends of the nanowire and possibly one or several gate electrodes to the center region between the ohmic contacts. A nanowire device typically comprises a large plurality of nanowires in a parallel configuration. The simplest, and the most common way, to provide external contact to the nanowires is to provide sheets, or layers of conducting material on appropriate "heights" of the nanowire. This is exemplified by the transistor structure 100 of FIG. 1a, comprising of a plurality of nanowires 105 grown from a substrate 102, each nanowire 105 provided with a source contact, a gate contact and a drain contact. External connection to the contacts are arranged by providing external electrodes, which also can be referred to as external contacts, in the form of a source conducting layer 110, a gate conducting layer 115 and a drain conducting layer 120. The conducting layers can be seen as forming conducting sheets extending throughout the device at different heights from the substrate. The diameters of nanowires are typically below 200 nm and the spacing between the nanowires are in the same range, there will be a substantial geometrical overlap between the (external parts of the?) electrodes. Given that the operation of the devices requires a potential differences between the different gates this overlap will may cause substantial parasitic capacitances and increased leakage currents between the electrodes. These effects reduce the performance of the devices.

Lateral technologies, which today predominate in microelectronics, allows electrodes to be fabricated with limited overlay. In the lateral technology, the overlay is mainly determined by the thickness of the electrode, whereas the overlay in vertical technologies is mainly given by the line width of the lithography used. In the vertical nanowire technology, there will always, as described above, be a direct unavoidable overlay between the electrodes. In contrast, lateral technologies allow electrodes to be fabricated with limited overlay. In addition, as compared to established microelectronic technologies the above mentioned parasitic effects will be larger for the nanowire technology. For a given current density the ratio between the drive current and the parasitic capacitances will be smaller for the nanowires due to the smaller geometrical dimensions. Hence, the parasitic effects are more critical in the nanowire technology compared to established microelectronic technology.

In U.S. Pat. No. 6,314,019 a cross-bar geometry with molecular wires is described, wherein in the junctions simple electronic devices, for example switches, are formed in the interaction between the two wires. The technique is not readily applicable to more complex electronic devices.

SUMMERY OF THE INVENTION

Obviously the prior art design of vertical nanowire device need improvements with regards to parasitic influences from the external electrodes, the parasitic capacitances and increased leakage currents, arising therefrom, severely impairing the performance of the device.

The object of the present invention is to provide a vertical nanowire design architecture that overcomes the drawbacks of the prior art architectures. This is achieved by the device as defined in claim 1.

The nanoscaled electronic device according to the invention comprises one or a plurality of nanowires. The nanowires are the main functional part in the device, for example forming the current channel in a transistor. The nanowires have been formed vertically from a substrate, for example by epitaxial growth. Contacts are arranged on the nanowire at different parts of the nanowire. In connection to the nanowire contacts are external electrodes, that connect at different levels, as seen from the substrate, of the device. The external electrodes are elongated, and typically and preferably stripe-like. According to the invention a first external electrode, or contacts, associated with contact(s) at a first part of the nanowire, and a second external electrode, associated with contact(s) at a second part of the nanowire are arranged in a cross-bar configuration. The cross-bar configuration minimizes the overlay of the external electrodes, hence, parasitic capacitances and current leakage can be avoided, or at least reduced. The contacts at a first part of the nanowire may for example be source contacts at the "root" of the nanowire and the contacts at a second part of the nanowire drain contacts at the top of the nanowire.

More levels of external electrodes can be introduced, for a example a external electrode level associated with a gate contact, in between the source and drain levels. The external electrodes can be arranged in a cross-bar configuration minimizing the overlay between the external electrodes at all levels. Alternatively the cross-bar configuration is pair-wise, minimizing the overlay between external electrodes at adjacent layers.

The most favorable architecture according to the invention is a perpendicular cross-bar geometry, i.e. the drain and source external electrodes forming an angle of around 90° then seen in the direction of the vertical nanowire. Even if other design constrains make it impossible to have an 90° angle between the external electrodes, a cross-bar geometry with an angle around 45° would efficiently limit the overlap and positively enhance the performance.

Thanks to the invention it is possible to provide electronic devices built around one or more nanowires with better performance, due to the better handling of parasitic capacitances and leakage currents.

Important advantages of the present invention include increased performance of diodes (speed and sensitivity), improved performance of transistors (speed and power handling), increased sensitivity of photodetectors, and increased performance of optical sources and detectors.

A further advantage with is that the architecture according to the invention can be employed not only for devices comprising of one nanowire but also to devices comprising rows or matrixes of nanowires.

Embodiments of the invention are defined in the dependent claims. Other objects, advantages and novel features of the invention will become apparent from the following detailed description of the invention when considered in conjunction with the accompanying drawings and claims.

BRIEF DESCRIPTION OF THE DRAWINGS

Preferred embodiments of the invention will now be described with reference to the accompanying drawings, wherein.

DETAILED DESCRIPTION

The arrangement and architecture according to the present invention will be described with a wrap-gated nanowire field effect transistor as a non-limiting example. The wrap-gated nanowire transistor exemplifies a device which is sensitive to parasitic capacitances and/or current leakage. Other devices that would be effected in similar ways, include, but is not limited to: LEDs, other types of diodes, for example quantum mechanical resonant tunneling diodes, bipolar transistors, solar cells and sensors.

Figure 1:
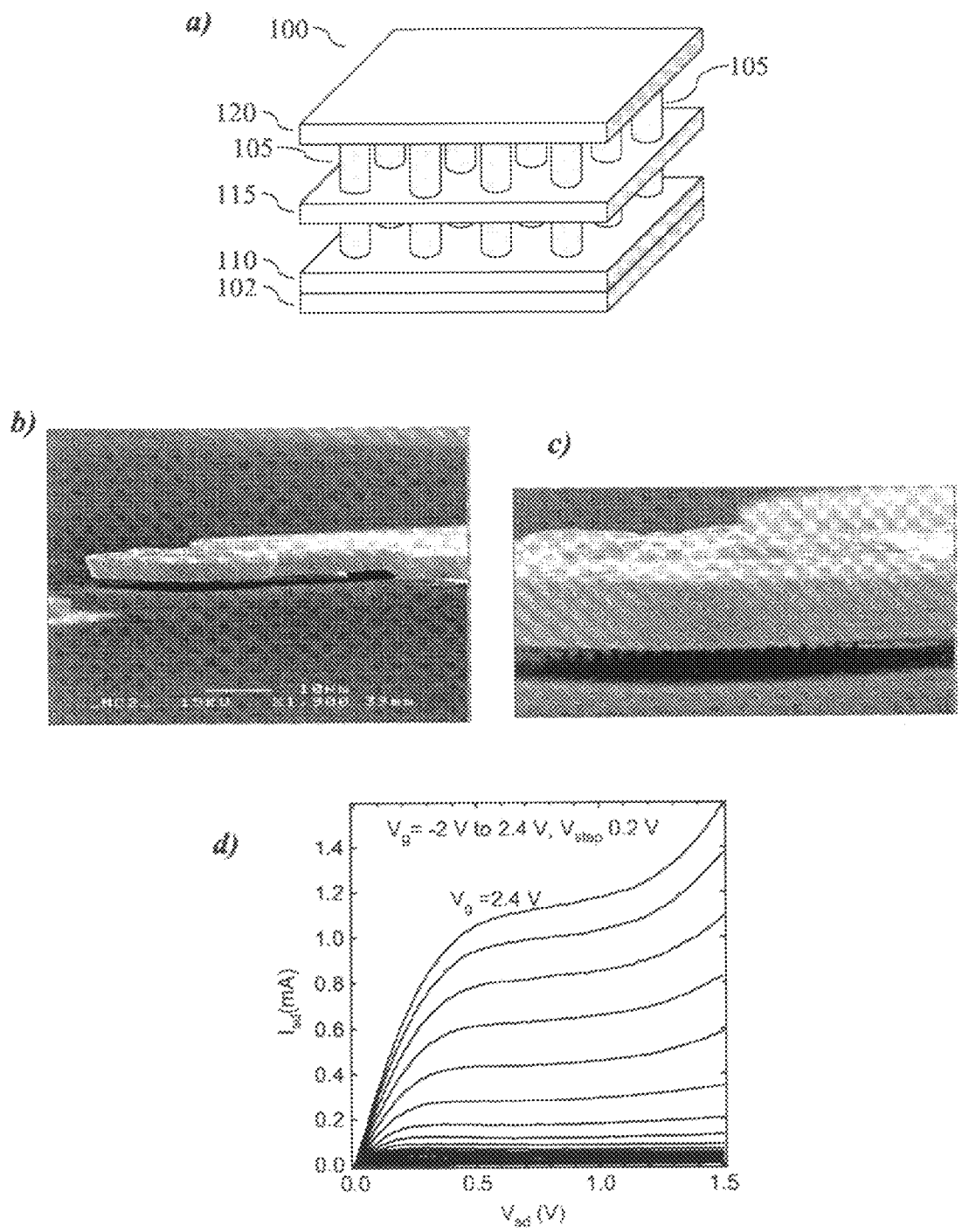
FIG. 1a schematically illustrates a prior art vertical nanowire field effect transistor where several nanowires are coupled in parallel between plate electrodes, b) is an image of fabricated transistor using an airbridge technology for the drain formation. In this transistor ~100 nanowires are placed in parallel between two plate electrodes, c) a higher magnification image, and d) room temperature IV characteristics of a 1-µm-gate length InAs transistor with ~100 nanowires in parallel as a channel.

The functionality of a device according to FIG. 1a is illustrated by the IV-characteristics of FIG. 1d. The device is a fabricated transistor using an airbridge technology for the drain formation, as illustrated in FIG. 1b-c. In this exemplary transistor ~100 nanowires are placed in parallel between two plate electrodes. The device is fabricated by electron beam lithography (EBL). It has been shown that nanowires can also be grown from metal particles defined by nano imprint lithography (NIL); changing the first lithography step from EBL to NIL would give a fabrication only based on parallel patterning which is important for batch fabrication. The architecture with two parallel large plate electrodes is attractive from a fabrication point of view, but problematic in that the device will be sensitive to parasitic. The effects of parasitic capacitances and current leakage in a device with the principle architecture of FIG. 1a will reduce the performance of the device.

Wrap-gated nanowire transistors are based on vertical nanowires around which a gate is formed by post-growth processing and where the field effect is used for the transistor action, like in a regular FET. Materials with a band gap narrower than Si (like InAs, InSb, and the alloys of In, As, Ga, Sb and P) are preferably used in the nanowires in order to enhance the device properties via increased mobility and saturated electron velocity. The nanowires, which act as channels in the transistors, are grown using selective epitaxy where particles are used to assist the anisotropic growth. Chemical Beam Epitaxy or different types of Vapour Phase Epitaxy methods may be employed for the growth. Lithographic methods or metal particle deposition are used to define the metal particles and the size of the metal particle determines the diameter of the wires. Typically, diameters below 200 nm, with a standard deviation of 5%, can be fabricated. Wires only grow at the defined locations and the planer growth rate is negligible in this particle assisted growth mode.

Figure 2:
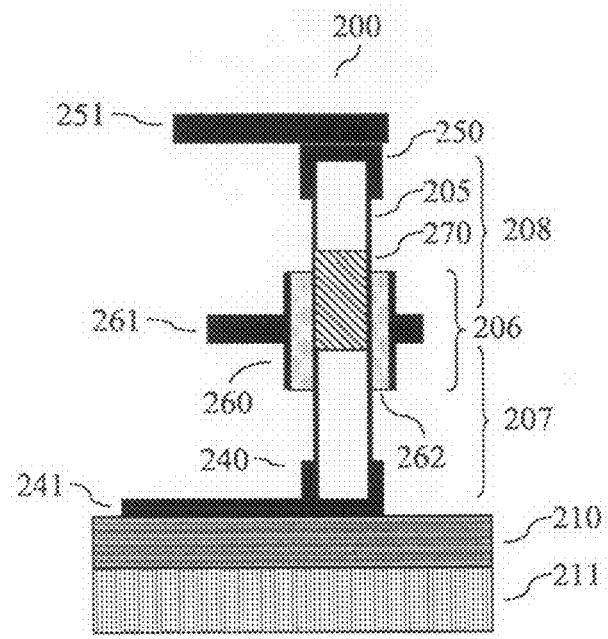
FIG. 2 illustrates schematically a cross-section of a vertical nanowire field effect transistor for which the architecture according to the present invention would be beneficiary.

FIG. 2 illustrates schematically a wrap-gate transistor layout which would benefit from the architecture according to the present invention. The transistor 200 utilizes one nanowire 205 as a current channel. The nanowire 205 is at one end provided with a source contact 240, and in the other end a drain contact 250. In between, preferably approximately at the centre of the nanowire is a gate contact 260 enclosing a portion, the gate portion 206 of the nanowire 205. In a working device the source contact 240, the gate contact 260 and the drain contact 250 are accessed via the source external electrode 241, the gate external electrode 261 and the drain external electrode 251, respectively. The nanowire 205 are grown on a substrate 210, that support the wire growth mode. The substrate 210 can be, for example, S.I. GaAs, S.I. InP, Si, $n^+$-InP, or SOI. A further layer 211, for example a 2D epitaxial layer, such as $n^{++}$-InP, $n^{++}$-GaAs, $n^{++}$-Si, poly-Si etc, can be provided in connection with the substrate to achieve low access resistance in the transistor. It may preferably be grown on a SI-substrate of InP or GaAs. The layer 211 may also be omitted. The substrate may acts as source contact. Alternatively, the source contact is a patterned layer 212, which is used for the growth of the wires and simultaneously reduces the parasitic capacitance of the gate contact and gate pad. Parts of this layer may be exchanged to a metal film to further reduce access resistance. The conductive part of patterned layer 212 may form the source external electrodes. The drain contact may be formed with an airbridge technology to reduce parasitics, but a chemically and mechanically stable layer from an insulating inorganic or organic film such as $SiN_x$ may be used as an insulator between the drain and substrate. This layer is etched away from the top of the wires before the top contact is formed.

The wrap-gate contact 260 (with a length of 5 to 500 nm) is isolated from the substrate 210 and channel by a dielectric layer 262 (1-50 nm thick) resulting in a Metal Insulator Semiconductor Field Effect Transistor (MISFET); $SiN_x$ or $SiO_2$ may be used as insulator but different insulating materials including high-k dielectrics are possible. The insulating layer may be applied by a deposition method or by oxidation of a semiconducting layer, radially grown around the wire. It is also possible to use epitaxially grown semiconductor layers (core/shell nanowires) of a band gap that is wider than the band gap in the channel region to separate the gate from the channel. In this case the layout resembles a vertical Metal Semiconductor Field Effect Transistor (MESFET) or a vertical High Electron Mobility Transistor (HEMT).

The gate can be formed by a number of deposition and etch steps including, growth of wires on a semiconductor substrate, deposition of gate dielectric with controlled thickness, deposition of gate metal via sputtering, evaporation or chemical deposition, spin-on of organic film, etch-back of polymer to define gate length (typically 5 to 500 nm), and wet-etch of gate metal. After these, or corresponding procedures, the gate wraps around the base of the wire as is shown in FIG. 2.

The drain contact airbridge is preferably fabricated so that it wraps around the top of the wires. This gives a large contact area compared to the size of the current channel. A thin contact layer of Ti may be used to increase the adhesion of the metal to the semiconductor surface and to decrease the contact resistance.

Figure 4:
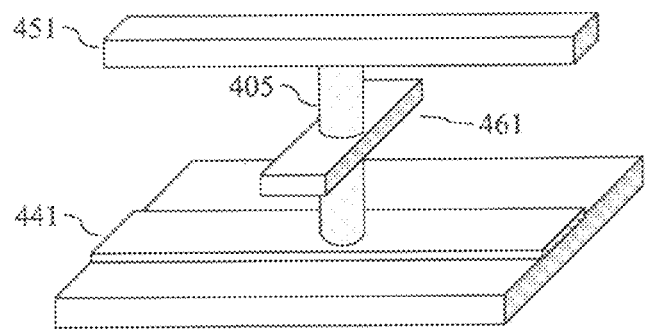
FIG. 4 illustrates schematically a three-terminal nanowire device where the overlay of the external electrodes are pair-wise minimized according to one embodiment of the invention.

In the implementation shown in FIG. 4 only one active nanowire with wrap-gate is shown, but a number of nanowires can be placed in parallel and combined to a channel in the transistor to get the desired drive current and transconductance.

Methods of growing nanowires are known in the art, see for example U.S. 2003/010244, as well as a variety of lithographic methods for forming external electrodes etc. To further improve the performance of the device the nanowire may be provided with one or more heterostructures, comprising of segments of material with band gaps that differ from the nanowire. Methods of providing heterostructures to a nanowire is described in U.S. 2004/0075464.

According to the architecture of the invention, in order to improve the performance of the electronic device, for example and in particular the RF-performance of a FET transistor, the parasitic capacitances and resistances are reduced. This is achieved by:

minimizing the area the external electrodes occupy, as seen from the direction of the vertical nanowire 205. However, care need to be taken to ensure that sufficient current flow is possible in the external electrodes, and minimizing the overlay between external electrodes connecting to different parts, or levels, of the nanowire 205.

In the above described implementation example, the gate length (t) is controlled by the deposition and etching conditions and not by the lithographic line width, as in prior art, which allows for scaling of the transistor by control of deposition and etching methods in contrast to conventional transistor design. The length of the source and drain regions should preferably in addition be optimized to reduce the parasitic gate-source and gate-drain capacitance, but at the same time the total length of the wire should be sufficiently short to reduce the access resistance in the transistor. In particular the external electrodes 241, 241, 251 to the source, drain and gate contacts should be placed in a cross-bar geometry where the overlay of the regions is minimized.

Figure 3A:
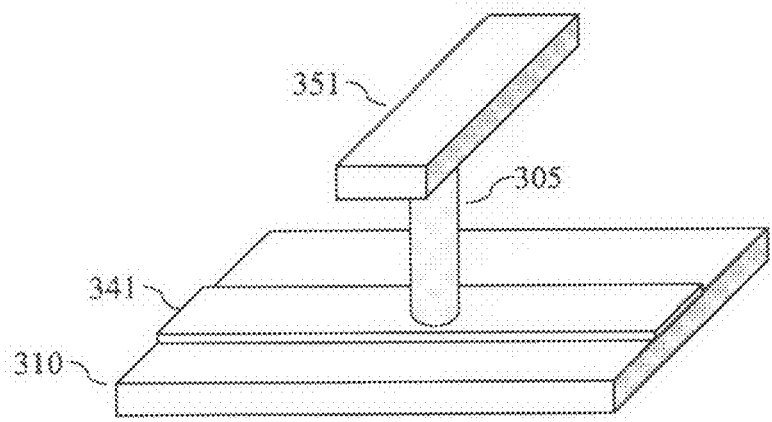
FIG. 3a-c illustrates schematically a two-terminal nanowire device where the external electrodes are placed in a cross-bar geometry according to the architecture of the present invention.
Figure 3B:
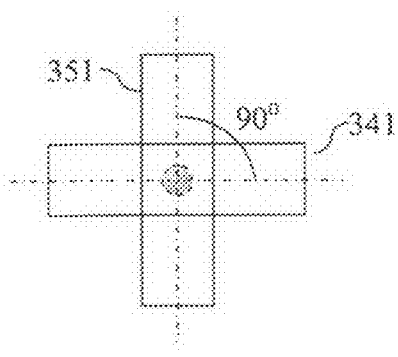
Figure 3C:
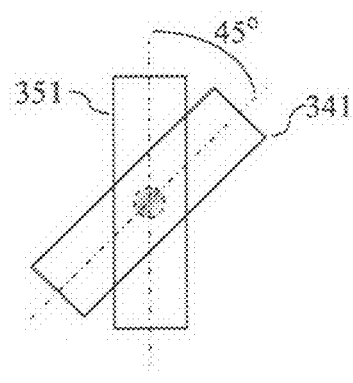

In view of the above described criteria's for the architecture according to the invention embodiments corresponding to different types of vertical nanowire electronic devices will be described. For a two-terminal device (i.e. a diode, a photodiode, solar cell, and a light-emitting diode) the overlay can be minimized by placing the two external electrodes in a cross-bar geometry, as shown for a one-wire diode in FIG. 3a. The two external electrodes, the source external electrode 341 and the drain external electrode 351, widths 10 nm to 1 μm, are formed in a stripe geometry using lithographic methods. The source external electrode 341 is shown to be placed on the substrate 310. Alternatively, the drain external electrode may rest on the substrate 310. The external electrodes connect to the nanowire 305. The connections are depicted to be at the end of the nanowire, but one or both of the connection can be on other levels than the root and end of the nanowire. In this implementation the overlay is reduced from (wire spacing)$^2$ to (width of external electrode)$^2$. The most favorable architecture is a perpendicular cross-bar geometry, i.e. the drain and source external electrodes forming an angle of around 90° then seen in the direction of the vertical nanowire. Even if other design constrains make it impossible to have an 90° angle between the external electrodes, a cross-bar geometry with an angle larger than 45° would efficiently limit the overlap and positively enhance the performance. For the purpose of this application a cross-bar configuration, or cross-bar geometry, refers to external electrodes in two different layers of a nanoscaled device, the external electrodes being elongated in one direction and the centre lines of the external electrodes in one layer forming an angle ranging from, and including, 45° to, and including, 90° with the centre lines of the external electrodes in another layer. A 90° crossbar configuration, as seen from above, or below in the direction of the nanowire is illustrated in FIG. 3b, and a 45° cross-bar configuration in FIG. 3c.

Figure 5A:
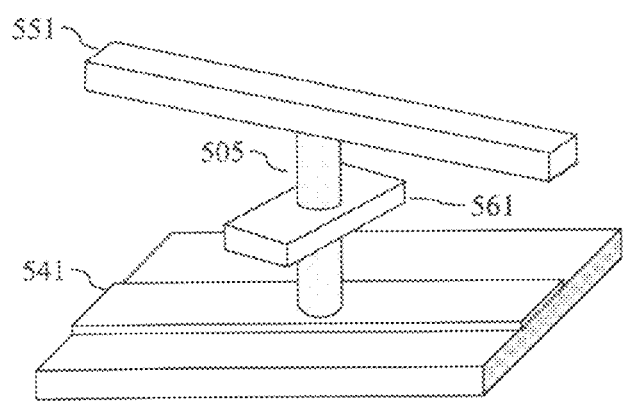
FIG. 5a-b illustrates schematically a three-terminal nanowire device where the overlay of all the external electrodes is minimized according to one embodiment of the invention.
Figure 5B:
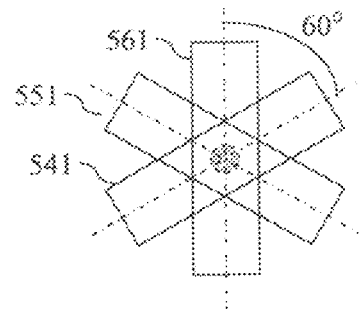

The overlay for a three-terminal transistor structure, for example the wrap-gate transistor described above, can be minimized by using a stripe geometry for the source 441, gate 461 and drain 451 external electrodes, as illustrated in FIG. 4. Preferably, the overlay between the gate contact 461 and the source contact 441 and the gate contact 461 and the drain contact 451 are pair-wised minimized, since the source-to-drain spacing is longer and consequently the overlay capacitance arising between the source external electrode 441 and the drain external electrode 451 is smaller. This typically leads to an architecture wherein the source external electrode 441 and the gate external electrode 461 forms an angle of around 90° then seen in the direction of the vertical nanowire, constituting a first optimized contact pair. The gate external electrode 461 and the drain external electrode 451 form a second optimized pair, with an angle of around 90° there between. The source external electrode 441 and the drain external electrode 451 overlaps. The three electrodes (width 10 nm to 1 μm) are formed in a stripe geometry using lithographic methods. Alternatively, as illustrated in FIG. 5a-b, the external electrodes are arranged so that total overlap is minimized, i.e. the source external electrode 541 forms an angle of around 60° with both the gate external electrode 561 and the drain external electrode 551. The embodiment has been exemplified with three external electrodes, but plurality of external electrodes connecting to the nanowire 205 can be handled in a similar manner. Typically and preferably, if more than three external electrodes are involved, the pair-wise minimization gives the best performance.

Figure 6A:
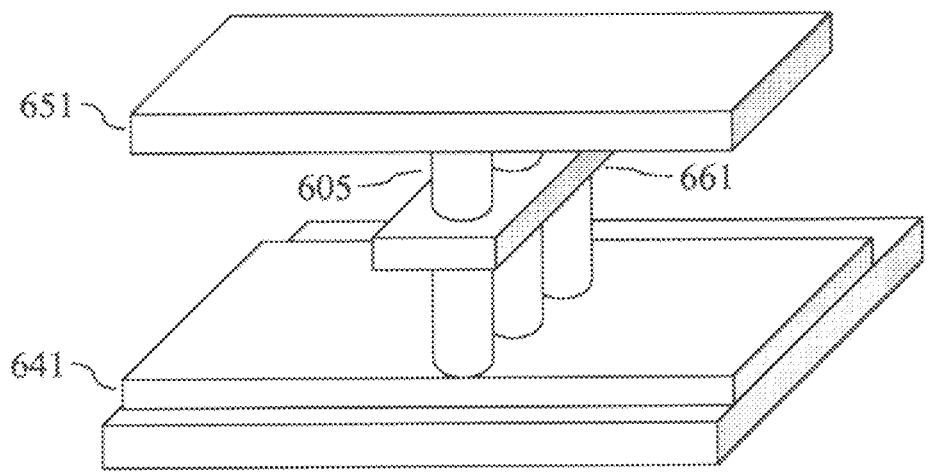
FIG. 6a-b illustrates schematically a three-terminal nanowire device where the external electrodes are placed in a cross-bar geometry and a) the nanowires are placed along the gate external electrode, and b) the nanowires are placed along the source and drain electrode, according to embodiments of the invention.
Figure 6B:
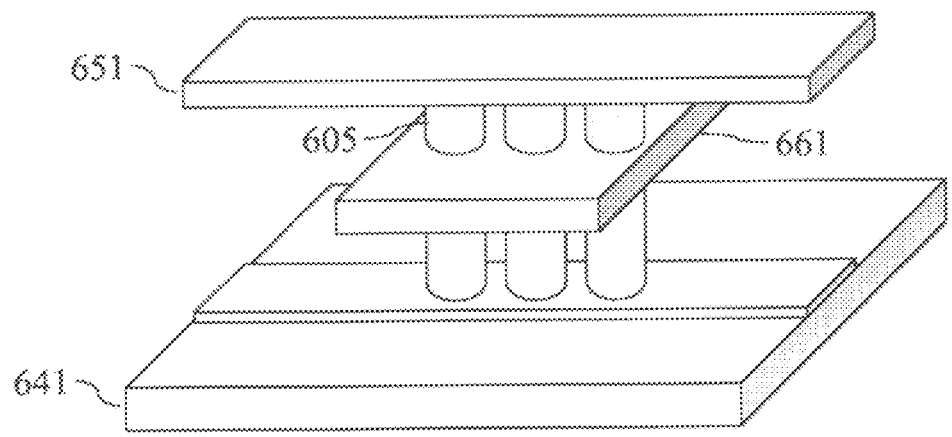

In the case one nanowire do not provide sufficient drive current in the transistor, several nanowires may be placed in parallel, as schematically illustrated in FIG. 6a-b. By placing the nanowires 605 in a row along one of the electrodes, the overlay may still be minimized. Preferably, in a three external electrode architecture, the middle external electrode, for example the gate contact is in the form of a stripe 661, 10 nm to 1 μm, and the plurality of nanowires 205 are placed in a row according to the stripe-shaped gate external electrode 661. The source 641 and drain 651 external electrode will in this embodiment have a more plate-like appearance, which can be acceptable due to the larger distance between them As an alternative, in the case of a the device comprising a single nanowire or a row of nanowires, a first external electrode can end at the nanowire, or the row of nanowires and extending from the nanowire in only one direction. The second external electrode preferably also ends at the nanowire and extends in another direction than the first external electrode. If both the electrodes ends at the nanowire, the angle between them is of less importance and angles outside the above defined range is functional. A further alternative is that the external electrodes at different levels are placed in parallel, as seen from the direction of the nanowire, but with an offset in the position. The contacts on the nanowire are connected by small branches from respective external electrode.

Figure 7:
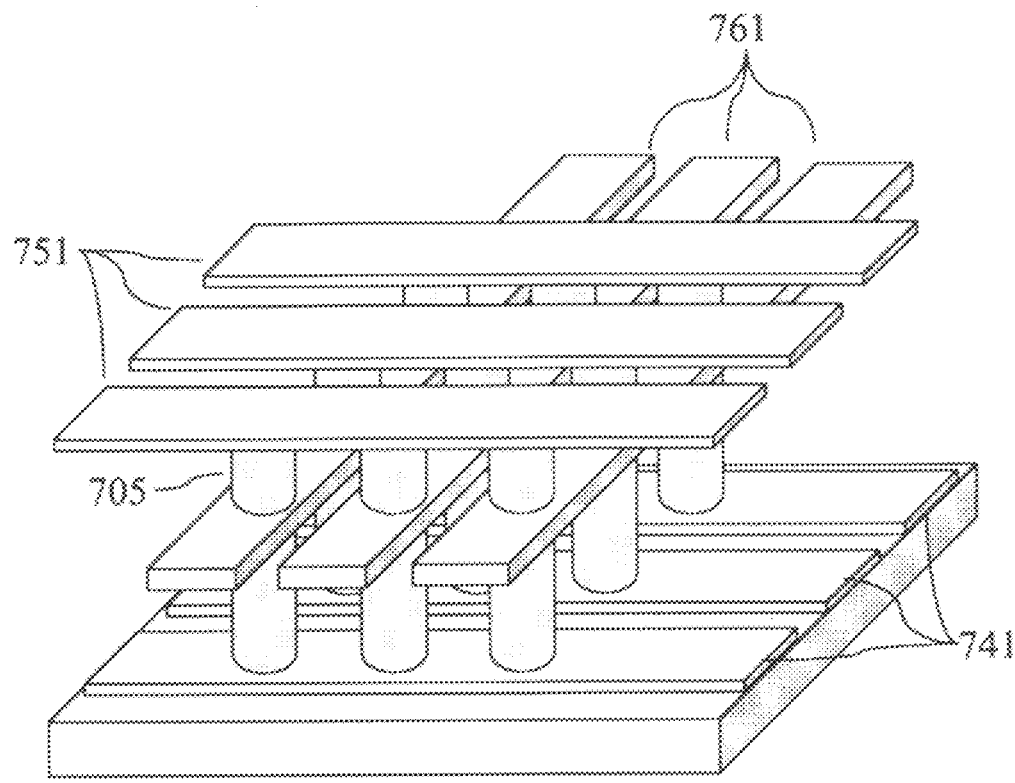
FIG. 7 illustrates schematically a three-terminal nanowire comprising a plurality of nanowires in a matrix formation where the overlay of external electrodes is minimized by a cross-bar architecture according to one embodiment of the invention.

If a large plurality of nanowires are required for the device, a matrix arrangement, the nanowires 705 forming columns and rows, may be advantageous, as schematically illustrated in FIG. 7. The stripe-formed gate external electrodes 761 interconnects the nanowires of each column of the nanowire matrix, and striped-formed the source 741 and drain external 751 contacts interconnect the nanowires row-wise. If care is taken to minimize the area of the external electrode stripes the parasitic capacitance is reduced as compared to the prior art configurations illustrated by FIG. 1a. Seen from the direction of the nanowires the external electrode stripes forms a mesh with nanowires positioned at the points of interception.

It should be noted that, in particular taken in consideration that the designs are in the nanoscale region, the processes of fabrication gives variation in shapes, distances and angles between the external electrodes. This will be particularly evident in a mesh-like structure as described in the embodiment above. Hence, some crossings of external electrodes may have an angle that deviate from the preferred range (from around 45° to around 90°). However, the majority of crossings should be within the range.

The invention has mainly been described above with reference to a few embodiments. However, as is readily appreciated by a person skilled in the art, other embodiments than the ones disclosed above, including the change of source and drain regions, are equally possible within the scope of the invention, as defined by the appended patent claims.

Generally, all terms used in the claims are to be interpreted according to their ordinary meaning in the technical field, unless explicitly defined otherwise herein.

The invention claimed is:

1. A nanoscaled electronic device comprising at least one semiconductor nanowire as an active part of the device, the semiconductor nanowire being formed from a substrate, the semiconductor nanowire provided with at least a first contact and one further contact connecting to the semiconductor nanowire at different levels from the substrate, wherein a first external electrode connecting to the first contact, and at least one further external electrode connecting to the at least one further contact, the first external electrode arranged so that the overlap, as seen in the direction of the nanowire, with the at least one further external electrode is minimized;
   wherein the first external electrode is arranged to extend from the semiconductor nanowire in only one first direction in a first level from the substrate, and the at least one further external electrode is arranged to extend from the nanowire in only one further direction in a second level from the substrate different from the first level.

2. The nanoscaled electronic device according to claim 1, wherein the first external electrode and/or the at least one further external electrodes are stripe-formed to limit the extension in planes perpendicular to the direction of the nanowire.

3. The nanoscaled electronic device according to claim 1, wherein the first external electrode is arranged in a cross-bar configuration with the at least one further external electrode.

4. The nanoscaled electronic device according to claim 3, wherein the first and the at least one further external electrodes are of an elongated form and arranged so that the center line, in the elongated direction, of one electrode forms an angle of 45° or larger with the center line, in the elongated direction, of the other electrode.

5. The nanoscaled electronic device according to claim 3, wherein the first contact connecting to the nanowire at the first level, the at least one further contact comprises a second contact connecting to the nanowire at the second level and further comprising at least a third contact connecting to the nanowire at a different level from the first and second contacts, and a third external electrode in connection with the third contact.

6. The nanoscaled electronic device according to claim 5, wherein the third contact is arranged in between the first and second contact and the third external electrode is arranged in a cross-bar configuration with both the first external electrode and the second external electrode.

7. The nanoscaled electronic device according to claim 5, wherein the third contact is arranged in between the first and second contact, the first, second and third external electrodes being of an elongated form and arranged so that the centre lines, in the elongated directions, of one electrode forms an angle of around 60° with the adjacent electrodes.

8. The nanoscaled electronic device according to claim 5, wherein the third contact is arranged in between the first and second contact and the third external electrode is arranged in a cross-bar configuration with both the first external electrode and the second external electrode, and the first external electrode is arranged in parallel with the second external electrode.

9. The nanoscaled electronic device according to claim 3, comprising a plurality of nanowires coupled in parallel by at least one of the external electrodes, the plurality of nanowires arranged in a row, and wherein at least one of the electrodes is elongated following the direction of the row of nanowires.

10. The nanoscaled electronic device according to claim 9, wherein the first external electrode and the second external electrode are sheet-formed and the third external electrode is stripe-formed and follows the row of nanowires.

11. The nanoscaled electronic device according to claim 9, wherein the first external electrode and the second external electrode are stripe-formed and follows the row of nanowires and the third external electrode is sheet-formed.

12. The nanoscaled electronic device according to claim 1, comprising
  a plurality of nanowires arranged in matrix configuration with a plurality of rows and columns,
  first external electrodes of a first set of external electrodes connecting with first contacts of the nanowires, each first external electrode connecting to all nanowires in one corresponding row of the nanowire matrix;
  second external electrodes of a second set of external electrodes connecting with second contacts of the nanowires, each second external electrode connecting to all nanowires in one corresponding column of the nanowire matrix; and the external electrodes of the first and second sets of external electrodes arranged in a crossbar configuration.

13. The nanoscaled electronic device according to claim 12, wherein the external electrodes are elongated in one direction, and the first external electrodes of the first set of external electrodes are essentially parallel and the second external electrodes of the second set of external electrodes are essentially parallel, and the first and second set of external electrodes are arranged so that the centre lines, in the elongated directions, of the external electrode in the first set, on average forms angles of 45° or larger with the centre lines, in the elongated directions, of the external electrodes of the second set of external electrodes.

14. The nanoscaled electronic device according to claim 12, further comprising a third set of external electrodes connecting to third contacts at a third level on the nanowires, the third external electrodes arranged in a cross-bar configuration with either the first or the second external electrodes.

15. The nanoscaled electronic device according to claim 1, wherein the first external electrode is arranged in parallel with the at least one further external electrode as seen from the direction of the nanowire, but with an offset in their positions.

16. The nanoscaled electronic device according to claim 1, comprising a plurality of external electrodes, each arranged at a different level of the nanowire and each extending in only one direction from the nanowire, the external electrodes arranged in a fan-like arrangement as seen from the direction of the nanowire.

17. The nanoscaled electronic device according to claim 5, wherein the first, the second and the third contacts correspond to source or drain or gate contacts, and the nanoscaled electronic device is arranged to operate as a transistor.

18. An optical device comprising the nanoscale electronic device according to claim 1.

19. A light emitting diode comprising the nanoscale electronic device according to claim 1.

20. A diode comprising the nanoscale electronic device according to claim 1.

* * * * *